United States Patent
Sanchez et al.

(10) Patent No.: US 8,260,587 B2
(45) Date of Patent: Sep. 4, 2012

(54) METHOD AND SYSTEM FOR SIMULATING COMPLEX SYSTEMS BY INTEGRATING SYSTEM DYNAMICS MODELS

(75) Inventors: Hernando Sanchez, Boston, MA (US); Andrew Gallerani, Charlton, MA (US)

(73) Assignee: Raytheon Company, Waltham, MA (US)

( * ) Notice: Subject to any disclaimer, the term of this patent is extended or adjusted under 35 U.S.C. 154(b) by 769 days.

(21) Appl. No.: 12/211,332

(22) Filed: Sep. 16, 2008

(65) Prior Publication Data
US 2010/0070251 A1    Mar. 18, 2010

(51) Int. Cl.
G06F 7/60 (2006.01)
G06F 17/10 (2006.01)
G06G 7/48 (2006.01)

(52) U.S. Cl. .................................. 703/2; 703/6
(58) Field of Classification Search ............. 703/2, 6
See application file for complete search history.

(56) References Cited

U.S. PATENT DOCUMENTS

| | | | |
|---|---|---|---|
| 5,303,170 A | 4/1994 | Valko | |
| 5,980,096 A * | 11/1999 | Thalhammer-Reyero | 1/1 |
| 6,003,021 A | 12/1999 | Zadik et al. | |
| 6,029,156 A | 2/2000 | Lannert et al. | |
| 6,067,537 A | 5/2000 | O'Connor et al. | |
| 6,085,184 A | 7/2000 | Bertrand et al. | |
| 6,549,893 B1 | 4/2003 | Lannert et al. | |
| 6,658,398 B1 | 12/2003 | Bertrand et al. | |
| 6,735,490 B2 | 5/2004 | Anand et al. | |
| 6,735,556 B2 * | 5/2004 | Copel | 703/2 |
| 6,773,266 B1 | 8/2004 | Dornbush et al. | |
| 6,970,858 B1 | 11/2005 | Nichols | |
| 7,280,977 B2 | 10/2007 | Sengir et al. | |
| 2002/0052725 A1 * | 5/2002 | Wasynczuk et al. | 703/22 |
| 2003/0074163 A1 | 4/2003 | Anand et al. | |
| 2005/0171746 A1 * | 8/2005 | Thalhammer-Reyero | 703/2 |

OTHER PUBLICATIONS

Sterman, John D., "System dynamics modeling: Tools for learning in a complex world", 2001, California management review 43 (4): 8-25.*

Keenan, Philip T, Ph.D., Paich, Mark, Ph.D., "Modeling General Motors and the North American Automobile Market", General Motors Corp., Detroit, MI, Aug. 23, 2004, pp. 1-16.

(Continued)

*Primary Examiner* — Mary C Jacob
*Assistant Examiner* — Aniss Chad
(74) *Attorney, Agent, or Firm* — Daly, Crowley, Mofford & Durkee, LLP

(57) ABSTRACT

A method for simulating complex systems over time using a system dynamics approach is provided including defining a first model of a complex system, the first model having a first model variable; defining a second model of the complex system, the second model having a second model variable; executing the first model by modifying the first model variable to obtain a first model output; executing the second model by passing the first model output to the second model and modifying the second model variable based the first model output to obtain a second model output; defining a simulation result based on the first and second model outputs; and outputting the simulation result. Furthermore, the first model is either a non-subscripted system dynamics model or a subscripted system dynamics model, and the second model is either a non-scripted system dynamics model or a scripted system dynamics model.

26 Claims, 10 Drawing Sheets

OTHER PUBLICATIONS

Borshchev, Andrei and Filippov, Alexei, "From System Dynamics and Discrete Event to Practical Agent Based Modeling: Reasons, Techniques, Tools", The 22$^{nd}$ International Conference of the System Dynamics Society, Jul. 25-29, 2004, Oxford, England, 23 pages.

Schieritz, Nadine and GröBler, Andreas, "Emergent Structures in Supply Chains—A Study Integrating Agent-Based and system Dynamics Modeling", Proceedings of the 36$^{th}$ Annual Hawaii International Conference on System Sciences, Jan. 2003, 9 pages.

Repenning, Nelson P., "A dynamic model of resource allocation in multi-project research and development systems", System Dynamics Review vol. 16, No. 3, Wiley, Fall 2000, p. 173-212.

* cited by examiner

METHOD AND SYSTEM FOR SIMULATING COMPLEX SYSTEMS BY INTEGRATING SYSTEM DYNAMICS MODELS

BACKGROUND

As is known in the art, system dynamics modeling is an approach to studying the behavior of complex systems over time using feedback loops and delays. System dynamics modeling has found application in a wide range of areas including economics, epidemiology, population growth, ecological systems, and more.

System dynamics modeling generally begins by defining a problem to be studied or analyzed, for example, how to allocate a company's limited resources for a new product launch. The modeler defines stocks or entities which are increased or decreased during the simulation. For example, for the new product launch simulation, two types of consumers can be defined as stocks; (1) potential purchasers, and (2) new purchasers.

Next, the modeler defines flows of the simulation, for example, flows of consumers from potential purchasers to new purchasers. The modeler also defines feedback mechanisms which affect the stocks and flows. For example, advertising and word of mouth in the market may affect the flow rate. In particular, as more consumers become aware of the product either via advertising programs or through word of mouth, the flow of consumers from potential purchasers to new purchasers increases. The modeler may also define various equations for determining the flow, estimating parameters, and identifying initial conditions.

After the modeler tests and verifies the models, the modeler may perform various "what if" scenarios to better understand the dynamics of the models and to control the output. As is also known in the art, modelers may use computer software programs to build, simulate, and analyze system dynamics models. One such computer software program is Vensim® from Ventana Systems, Inc.

FIG. 1 illustrates a conventional prior art system dynamics model 100 for a complex system. The complex system relates to market dynamics for a company's product introduction, similar to the new product launch described above. Potential adopters 102 include the consumers who may purchase the product. Adopters 104 include the consumers who have purchased the product. New adopters 106 represent the rate of consumer adoption of the product, i.e., the increase or decrease in product purchasing by consumers.

Typically, potential adopters 102 and adopters 104 are referred to as model entities or stocks which accumulate or deplete over time. In this example, the stock of potential adopters 102 will decrease as the stock of adopters 104 increases. This assumes that the number of consumers remains constant over time.

New adopters 106 are referred to as the rate of change or flow in a model stock over time. In this example, the flow of new adopters 106 may increase when the product is introduced to the market as early potential adopters, known as innovators 103, rush to purchase the product. As the number of adopters 104 increases, the flow of new adopters 106 continues to increase as word of mouth about the product travels from adopters 104 to later potential adopters 102, known as followers 105. As the market begins to saturate, the flow of new adopters 106 begins to level off and may stop when the number of potential adopters is completely depleted.

During simulation, multiple versions or instances of the model are used to simulate the overall performance of the complex system. For example, a separate instance of the model may be created for each automobile on the road. The results for each separate instance are aggregated to obtain an overall system performance.

It would be desirable to provide a method of integrating system dynamics models at various levels of details, for example, by integrating non-subscripted and subscripted system dynamics model to view and analyze interactions between the various instances of the model, in addition to the overall system performance.

SUMMARY

In accordance with an aspect of the inventive systems, techniques, and concepts described herein, a method for simulating complex systems over time includes defining a first model of a complex system, the first model having a first model variable, defining a second model of the complex system, the second model having a second model variable, executing the first model by modifying the first model variable to obtain a first model output, executing the second model by passing the first model output to the second model and modifying the second model variable based the first model output to obtain a second model output, defining a simulation result based on the first and second model outputs, and outputting the simulation result. Furthermore, the first model is a non-subscripted system dynamics model or a subscripted system dynamics model, and the second model is a non-scripted system dynamics model or a scripted system dynamics model.

In further embodiments, the method can include one or more of the following features: the first model is reexecuted by passing the second model output to the first model and modifying the first model variable based the second model output to obtain the simulation result, the first model variable is a plurality of first model variables to describe a behavior of the first model, and the second model variable is a plurality of second model variables to describe a behavior of the second model; executing the first model further includes executing the first model over a first model time period, and executing the second model further includes executing the second model over a second model time period; the first model time period is different than the second model time period; the first model time period is a multiple of the second model time period; first and second model execution is controlled by at least one loop program based on the first and second model time period; passing the first and second model output is controlled by a data exchanger; first model execution further includes executing the first model a number of first model loop times and for each execution of the first model, the second model is executed a number of second model loop times; the first model output is passed to the second model, and the second model output is passed to the first model after executing the second model the number of second model loop times; first and second model execution is controlled by a loop program; passing the first and second model outputs is controlled by a data exchanger; the data exchanger is a data model having a data exchange variable to integrate the first and second model variables; the data model is one of a non-subscripted or subscripted system dynamics model; and, outputting the simulation results includes displaying the simulation results.

In another aspect, an embodiment of the invention provides a method for simulating complex systems over time including defining a first system dynamics model (F-SDM) of a complex system, the F-SDM having at least one first variable, defining a second system dynamics model (S-SDM) of the complex system, the S-SDM having at least one second variable, executing the F-SDM over a first time period by modifying the at least one first variable according to at least one F-SDM behavior to obtain a first output, executing the S-SDM by passing the first output to the S-SDM, and modifying the at least one second model variable according to at least one S-SDM behavior and the first output to obtain a second output, defining a simulation result based on at least one of the first or second outputs, and outputting the simulation results.

In further embodiments, the method includes or more of the following features: executing the F-SDM and the S-SDM is controlled by at least one loop program and passing the first and second outputs is controlled by a data exchanger; and, the S-SDM is at least two second system dynamics models and the data exchanger aggregates the at least one second output for the at least two second system dynamics models, and the data exchanger disaggregates the at least one first output.

In accordance with another aspect of the inventive systems, techniques, and concepts described herein, an article for simulating complex systems over time includes a machine-readable medium that stores executable instructions that cause a machine to define a first model of a complex system, the first model having a first model variable, define a second model of the complex system, the second model having a second model variable, execute the first model by modifying the first model variable to obtain a first model output, execute the second model by passing the first model output to the second model and modifying the second model variable based the first model output to obtain a second model output, define a simulation result based on the first and second model outputs, and output the simulation result. Furthermore, the first model is a non-subscripted system dynamics model or a subscripted system dynamics model, and the second model is a non-scripted system dynamics model or a scripted system dynamics model.

In further embodiments, the article can include executable instructions for causing a machine to perform one or more of the following: the first model is reexecuted by passing the second model output to the first model and the first model variable is modified based the second model output to obtain the simulation result; the first model variable is a plurality of first model variables to describe a behavior of the first model, and the second model variable is a plurality of second model variables to describe a behavior of the second model; the first model is executed over a first model time period, and the second model is executed over a second model time period; the first model time period is different than the second model time period; the first model time period is a multiple of the second model time period; first and second model execution is controlled by at least one loop program based on the first and second model time period; a data exchanger to control passing of the first and second model outputs; the data exchanger is a data model having a data exchange variable to integrate the first and second model variables first model execution further includes executing the first model a number of first model loop times and for each execution of the first model, the second model is executed a number of second model loop times; the first model output is passed to the second model, and the second model output is passed to the first model after executing the second model the number of second model loop times; and, first and second model execution is controlled by a loop program.

BRIEF DESCRIPTION OF THE DRAWINGS

The foregoing features of this invention, as well as the invention itself, may be more fully understood from the following description of the drawings in which.

DETAILED DESCRIPTION

In accordance with at least one embodiment of the inventive systems, techniques, and concepts described herein, a method and system are provided for simulating complex systems by integrating at least two system dynamics Vensim® models of the complex system. A Vensim® model is a dynamic feedback model used to simulate a complex system in simulation software from vendor Ventana Systems, Inc., STELLA® from ISEE Systems, and Powersim Studio from Powersim Solutions.

Example complex systems for simulation may include overall emissions from automobiles in a metropolitan area, a company's overall success in wining and completing projects, a spread of an infectious disease in animals, such as the spread of the flu virus in humans, or sales of a company's automobiles in a competitive market segment, such as the sales of sport-utility vehicles in Northern California.

Exemplary embodiments of the inventive systems, techniques, and concepts described herein include at least one first model, for example, a non-subscripted system dynamics Vensim® model, and at least one second model, for example, a subscripted system dynamics Vensim® model. The first and second models may be any one of a non-subscripted or subscripted system dynamics Vensim® model. Thus, the method includes combining any combination of non-subscripted or subscripted models, as further explained below.

Figure 1:
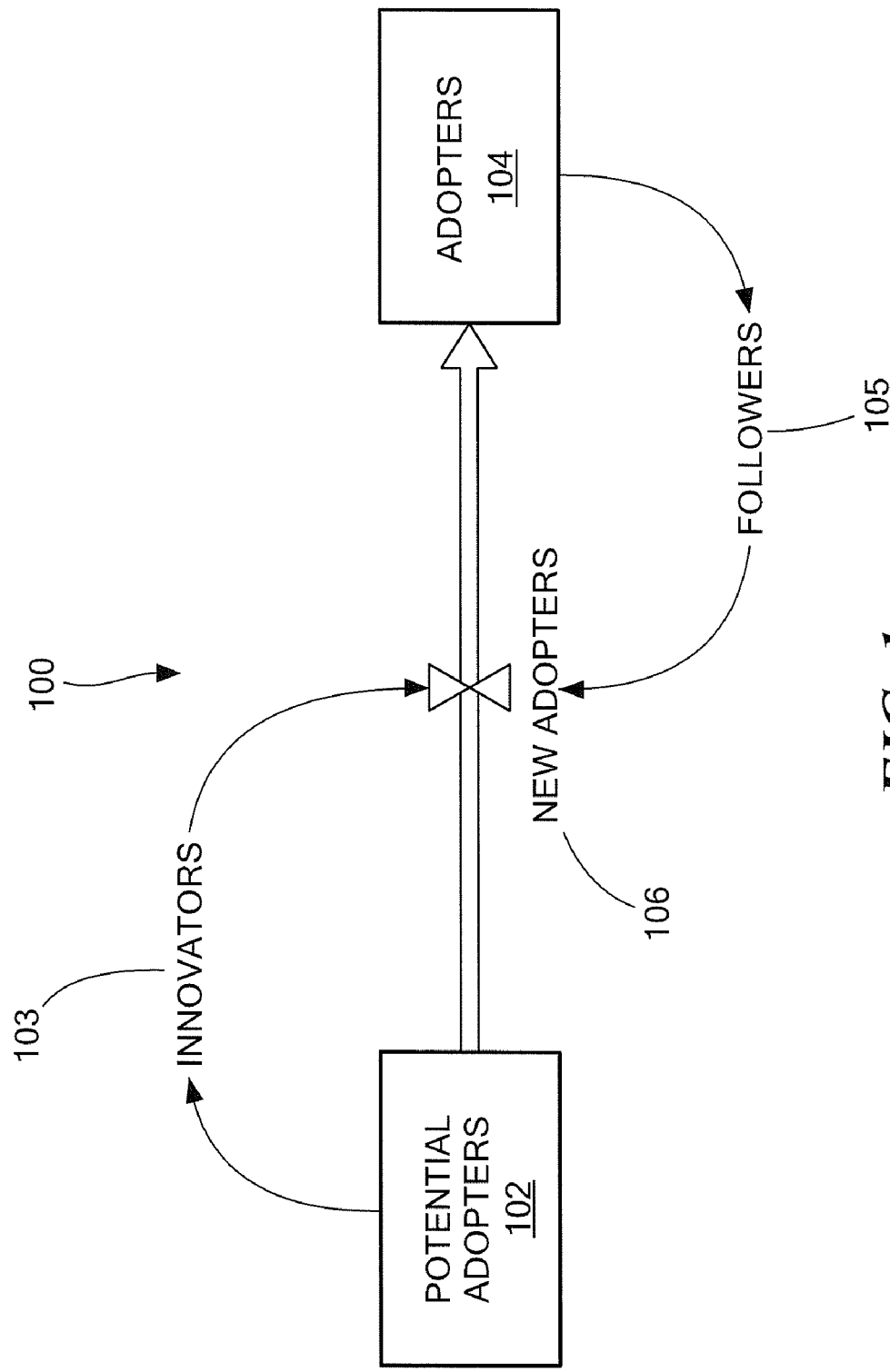
FIG. 1 illustrates a prior art system dynamics model simulating a product launch.
Figure 2:
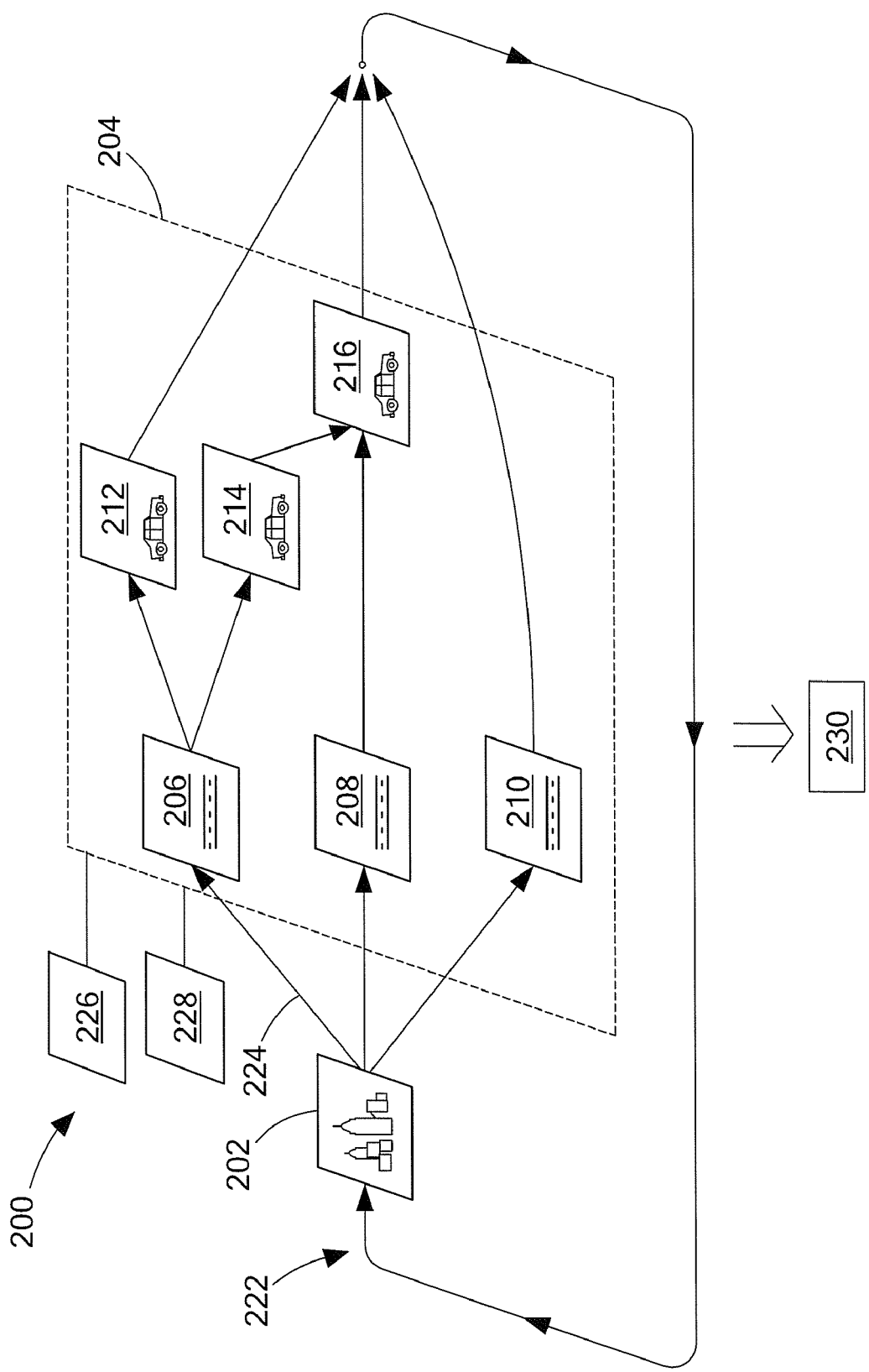
FIG. 2 is an overview of the integration of Vensim® models in accordance with the inventive systems, techniques, and concepts described herein.

Referring to FIG. 2, at least one embodiment of the inventive systems, techniques, and concepts described herein can be used for simulating a complex system 200 for overall vehicles emissions in a metropolitan area. The complex system 200 includes a non-subscripted Vensim® model 202 representing the overall emissions from a number of automobiles traveling over a number of roads. The method also includes multiple subscripted models (located within the box designated by reference number 204) representing instances of the vehicle emissions model 202. As shown in FIG. 2, subscripted models 206, 208, 210 represent vehicle emissions occurring on roads in the metropolitan area. Subscripted models 212, 214 represent vehicle emissions from two vehicles traveling on the road represented by model 206. Furthermore, subscripted model 216 represents vehicle emissions from the vehicle in model 214 as it travels from the road in model 206 to the road in model 208.

The complex system 200 includes input variables 222 and output variables 224 of the models, which are passed between the models during the simulation. The variables may be aggregated and/or disaggregated between the levels of the model. For example, output variables for models 212, 216, and 210, may be normalized, combined, and passed as an input variable to model 202. Alternatively, output variables for model 202 may be proportioned and passed as input variables to model 206, 208, and 210.

Furthermore, variables within models may need to be converted to common units before passing to other models. This may occur if, for example, vehicle emissions models use different units and equations to compute vehicle emissions. Vehicle emissions computations for foreign diesel trucks, for example, may be different than those for compact cars from the United States.

A data exchanger 226 may be used to pass variables between the models. For example, the data exchanger 226 may aggregate and disaggregate the variables and convert the variables between different models as described above.

After the completion of the simulation, for example, after one or more iterations of the models or after the expiration of a simulation time period, a simulation result 230 is outputted. In this example, the simulation result can include information related to overall vehicle emissions in the metropolitan area, as well as overall vehicle emissions on the roads and vehicles.

A loop program 228 may control the iteration of the models and determine whether to terminate the simulation as described above. For example, the loop program 228 may execute one or more of the models a number of times or sub-steps, pass the results to one or more other models, and execute the one or more other models. The loop program 228 is especially useful for controlling multiple models with different time steps. For example, one model may execute every few seconds, and another model may execute every few days. The loop program 228 may also asynchronously control one or more models, for example, based on events.

In this way, the inventive systems, techniques, and concepts described herein can be used to simulate and study complex system behavior at various levels of detail using integrated Vensim® models.

In the conventional art, although a modeler may define, view, and execute non-subscripted and subscripted models, the modeler has no control of the models during execution. For example, the modeler cannot configure model time loops or control how model variables are passed between the models. Instead, the modeler merely executes the simulations and views the results. The modeler may perform "what if" scenarios, but these are limited to redefining and re-executing the models. Thus, the conventional art is severely limited with respect to control over data exchanged between various models and time looping of the models.

Figure 3:
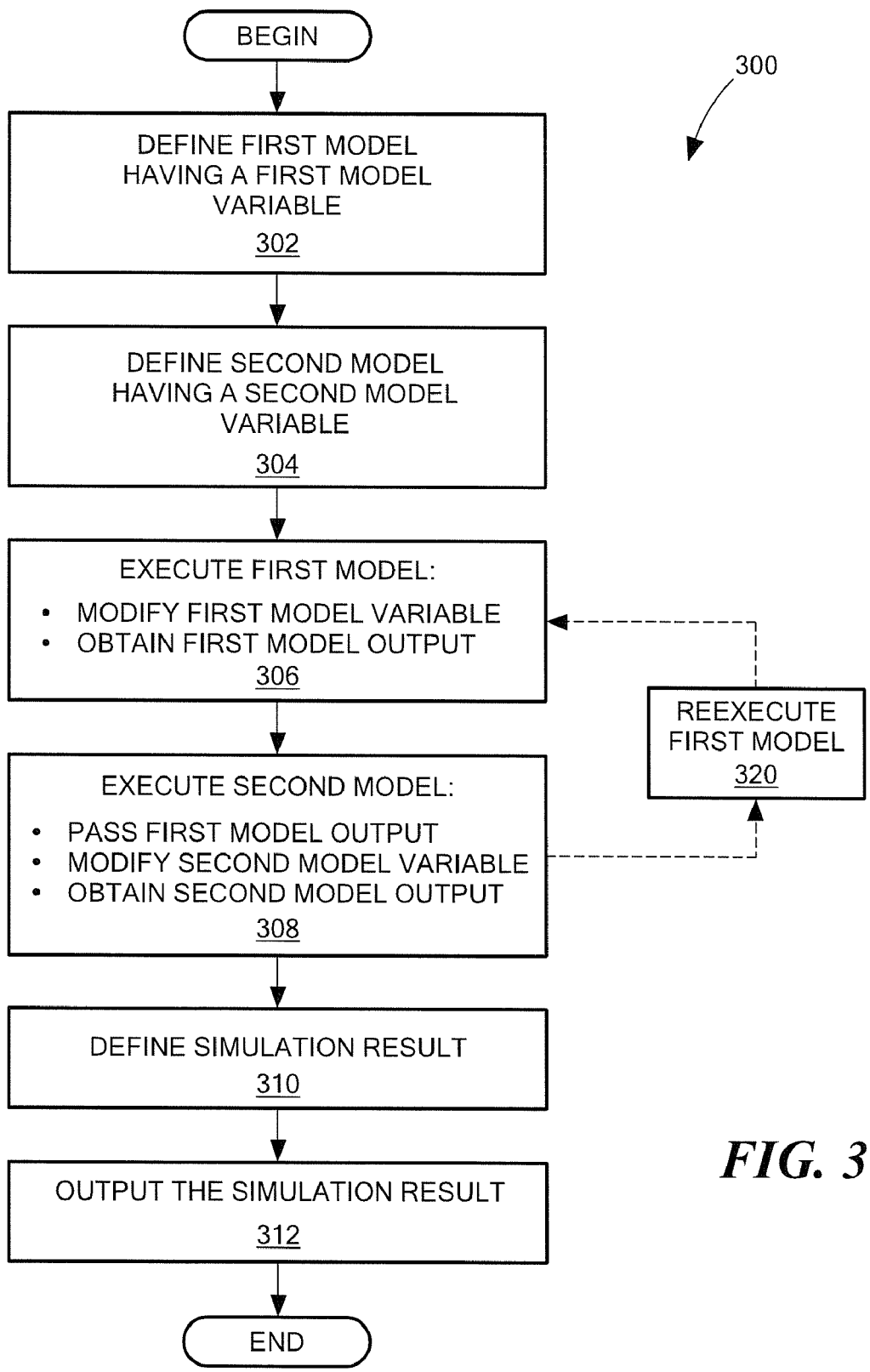
FIG. 3 is a flow diagram of a method for simulating a complex system over time.

Referring to FIG. 3, an exemplary method for simulating complex systems over time 300 is shown, including defining a first model of a complex system 302, the first model having a first model variable, and defining a second model of the complex system 304, the second model having a second model variable. The first model is executed 306 by modifying the first model variable to obtain a first model output. The second model is executed 308 by passing the first model output to the second model and modifying the second model variable based the first model output to obtain a second model output. A simulation result is defined 310 based on the first and second model outputs and outputted 312. Furthermore, the first and second models are either non-subscripted or a subscripted Vensim® models.

The method 300 may include re-executing the first model 320 by passing the second model output to the first model and modifying the first model variable based on the second model output to obtain the simulation result 312. Alternatively, the second model may be reexecuted either by feeding back the second model output to the second model or by re-executing the first model and passing the first model output to the second model as before. Alternatively, both the first and second models may be reexecuted, depending on the goals of the simulation.

In a further embodiment, the first model variable may include a group of first model variables. The group of first model variables may describe a behavior of the first model. The behavior includes a dynamic feedback mechanism of the model. Likewise, the second model variable may include a group of second model variables for describing a behavior of the second model.

Figure 4:
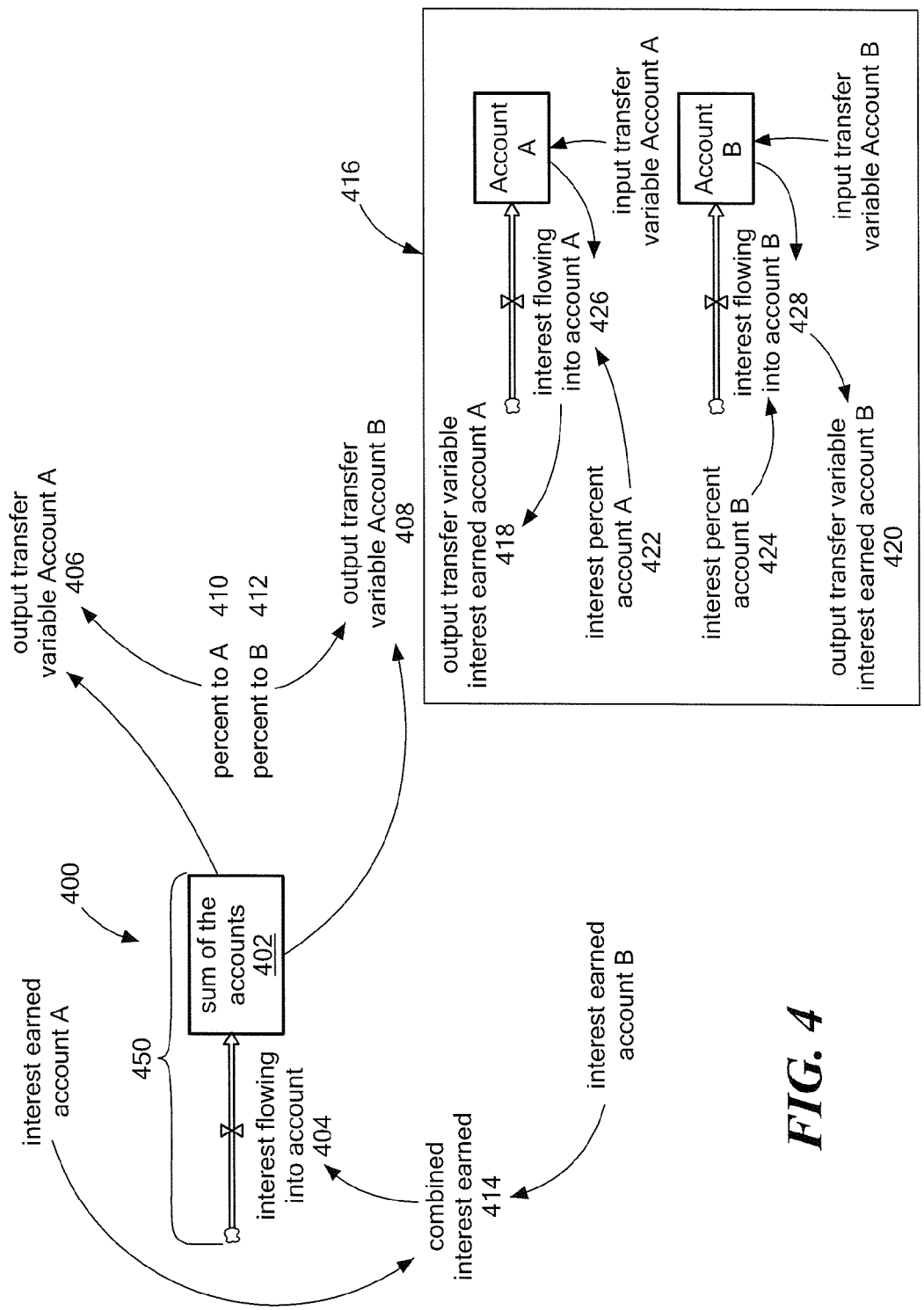
FIG. 4 illustrates an exemplary application of the inventive systems, techniques, and concepts described herein.

An example application of the inventive systems, techniques, and concepts described herein is shown in FIG. 4, simulating a complex system for the accumulation of earned interest in bank accounts. The complex system is modeled using a non-subscripted Vensim® model 400 describing the overall behavior of the system, and subscripted Vensim® models 416 describing interest-bearing accounts A and B, respectively. The non-subscripted model 400 represents the overall interest bearing behavior of accounts A and B. Subscripted model 416, represents the interest earned in accounts A and B, respectively. For each model cycle, the sum of the accounts can be split between the accounts and inputted into the subscripted models. Each subscripted model computes the interest earned based on the amount in the account multiplied by the account's interest rate. The interest earned calculations of the subscripted model 416, are combined and inputted into non-subscripted model 400. In the non-subscripted model 400, the combined interest is added to the sum of the accounts, and the simulation may be iterated to compute the next interest bearing cycle.

In this example, each bank account has a balance and an earned interest rate compounded over time. The sum of accounts 402 represents a total balance for all bank accounts S, which can be represented by Equation 1:

$$S = B_A + B_B \qquad \text{Equation 1}$$

In Equation 1, $B_A$ and $B_B$ represent the balance in accounts A and B, respectively.

Each of the bank accounts A and B make up a percentage of the total account value, $P_A$ and $P_B$, respectively. Using these variables, the balance in any given account N can be represented by Equation 2:

$$B_N = S * P_N \qquad \text{Equation 2}$$

The bank accounts A and B may be assigned an initial balance, for example, $60 and $40, respectively. These values may be used to compute the sum of accounts 402 in Equation 1. In this example, the sum of accounts equals $100.

Alternatively, the sum of accounts 402 may be assigned an initial value, for example, $100, and the percent values $P_A$ and $P_B$ may be assigned initial values, 60% and 40%, respectively. The bank account balance may be computed using Equation 2. In this example, the balance in accounts A and B will equal $60 and $40, respectively.

In FIG. 4, a stock-and-flow of the models 450 is represented by the sum of bank accounts 402 and the interest flowing into account 404. A non-subscripted model variable may include several output transfer variables 406, 408 representing a non-subscripted model output passed to the subscripted model 416. In this example, a subscripted variable percent 410, 412 may be used to calculate the account split 406, 408 for each account. For example, if the sum of accounts 402 equals $100, and percent variable 410, 412 for accounts A and B equals 60% and 40%, respectively, then the account split 406, 408 for A and B will equal $60 and $40, respectively.

The subscripted model 416, may include output variable interest earned variables 418, 420 and interest percent variables 422, 424. These variables may be used to compute the interest flowing $I_N$ into account variables 426, 428 for each account, which for account N can be represented by Equation 3:

$$I_N = B_N * I_R \quad \text{Equation 3}$$

In Equation 3, $I_R$ is the interest percent 422, 424 for each account. If the interest percent 422, 424 for account A and B equals 10% and 20%, respectively, then the interest earned 426, 428 for accounts A and B will equal $6 and $8, respectively.

Interest earned 426, 428 also represented output transfer variable account 418, 420 variables of the subscripted model 416, which are passed to the non-subscripted model 400. These values can be combined into a combined interest earned variable 414, which is the interest flowing into account 404. In this example, the combined interest earned variable 414 will equal $14, i.e. $I_A + I_B$.

In the non-subscripted model 400, the interest flowing into account 404 can be added to the sum of account 402 as shown in Equation 4:

$$S\mathrel{+}= I_{FLOW} \quad \text{Equation 4}$$

In Equation 4, $I_{FLOW}$ represents interest flowing into account 404. For example, if the interest flowing into account 404 equals $14, then the sum of accounts 402 will equal $114 after one simulation cycle.

In this example, the simulation result can be represented by Equation 5:

$$S\mathrel{+}= \int I_{FLOW} \quad \text{Equation 5}$$

In Equation 5, the interest flowing into account 404 is integrated over time and added to the sum of the accounts 402.

The simulation result is outputted using any number of methods. For example, TABLE 1 portrays the initial conditions and the first two iterations of the non-subscripted first model and subscripted second models. As can be seen by viewing TABLE 1, although account A has a higher balance at the start of the simulation, account B occupies an increasing portion of the sum of the accounts 402 because of its higher interest rate. In fact, in this example, the balance in account B will quickly become larger than the balance in account A.

TABLE 1

|   | Initial conditions ($) | First iteration ($) | Second iteration ($) |
|---|---|---|---|
| S | 100 | 114 | 130.2 |
| $B_A$ | 60 | 66 | 72.6 |
| $B_B$ | 40 | 48 | 57.6 |
| $I_A$ | 6 | 6.6 | 7.26 |
| $I_B$ | 8 | 9.6 | 11.52 |
| I | 14 | 16.2 | 18.78 |

The inventive method can be used to compare simulation results for non-subscripted, subscripted, and the integration between non-subscripted and subscripted models. In the above example, the simulation results clearly reveal that higher interest-bearing accounts are more favorable than lower interest-bearing accounts because they increase the rate of asset accumulation over time.

The simulation results can be displayed using any number of methods well known in the art, including, but not limited to, a computer screen, a printout, etc. For example, TABLE 1 can be displayed on a computer screen or in a computer printout.

Figure 5A:
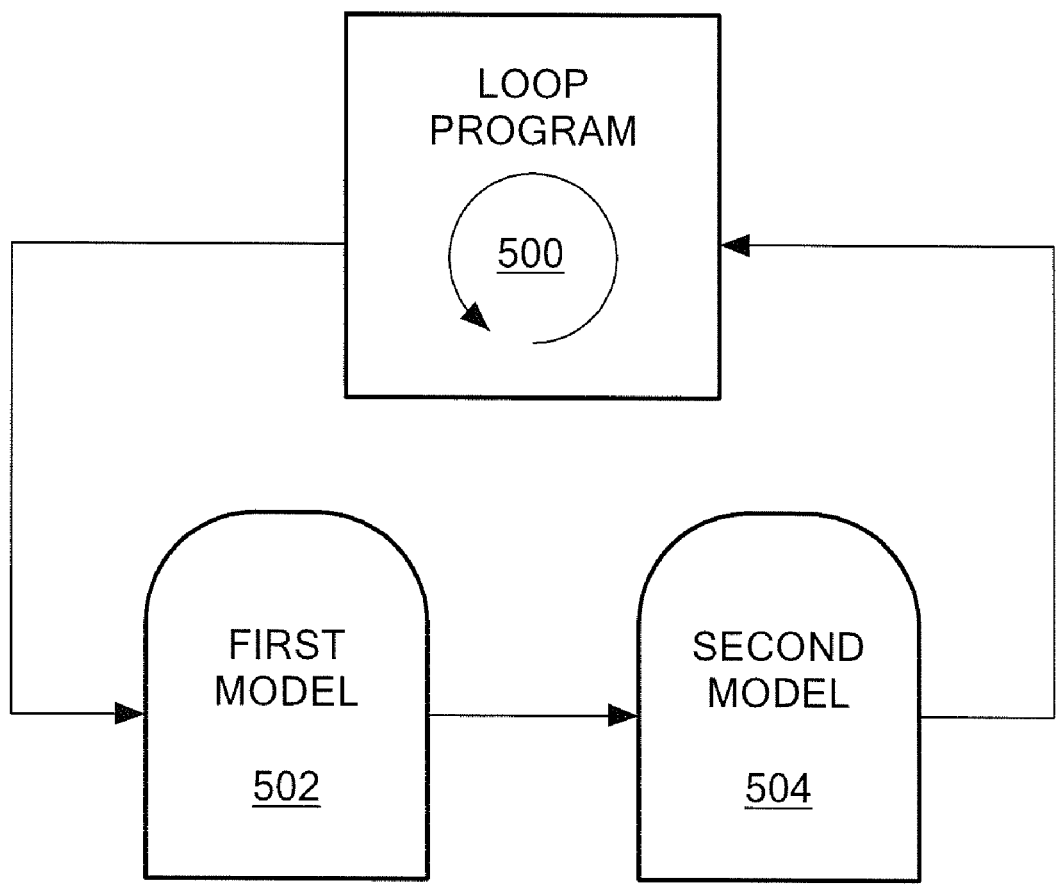
FIG. 5A is a diagram of a loop program to control the simulation.

Referring to FIG. 5A, the method can further include executing the first and second models 502, 504 using a loop program 500. Those of ordinary skill in the art will appreciate that the loop program 500 may be implemented as a software instruction stored in a memory device. The software instructions can be written in a software language well-known in the art, for example, C++, Java, etc. The software instructions can be organized into separate modules for executing a portion of the loop program. For example, one portion of the loop program 500 can execute the first model 502, and another portion of the loop program 500 can execute the second model 504.

As is well known in the art, the software functionality of the loop program 500 can be designed and developed in an integrated software development environment (IDE), for example, Microsoft Visual C++. Alternatively, a command line environment could be used, such as DOS.

The software instructions can be compiled into binary executables for storage in a computer memory. The binary executables can be loaded and executed in a Central Processing Unit (CPU) for executing the functionality of the loop program 500. The CPU can be supplied on chip. Dual CPUs can be supplied on a dual-core chip.

The loop program 500 can execute the first and second models 502, 504 multiple times. Furthermore, the loop program 500 may execute multiple first and second models 502, 504. For example, the loop program 500 may execute two, three, four, etc. second models 504, and pass the outputs of these models to a first model 504.

In the accumulation of interest example above, the loop program 500 can begin the simulation by setting an initial time $T_0$ and executing each of the models for period of time $t_a$. The loop program 500 can also set other initial conditions, such as the interest rates for the accounts.

The loop program 500 can reexecute one or both of the non-subscripted and subscripted models over any number of subsequent time periods $t_a$ as required by the simulation. For example, the loop program 500 can reexecute the subscripted models staring at $T_0 + t_a$, and ending at $T_0 + 2t_a$.

The loop program 500 can adjust any of the first or second variables as required by the simulation. For example, in the above accumulation of interest example, the loop program 500 can adjust the percent variables as appropriate, since the accounts will make up a different portion of the sum of accounts after each loop execution.

Figure 5B:
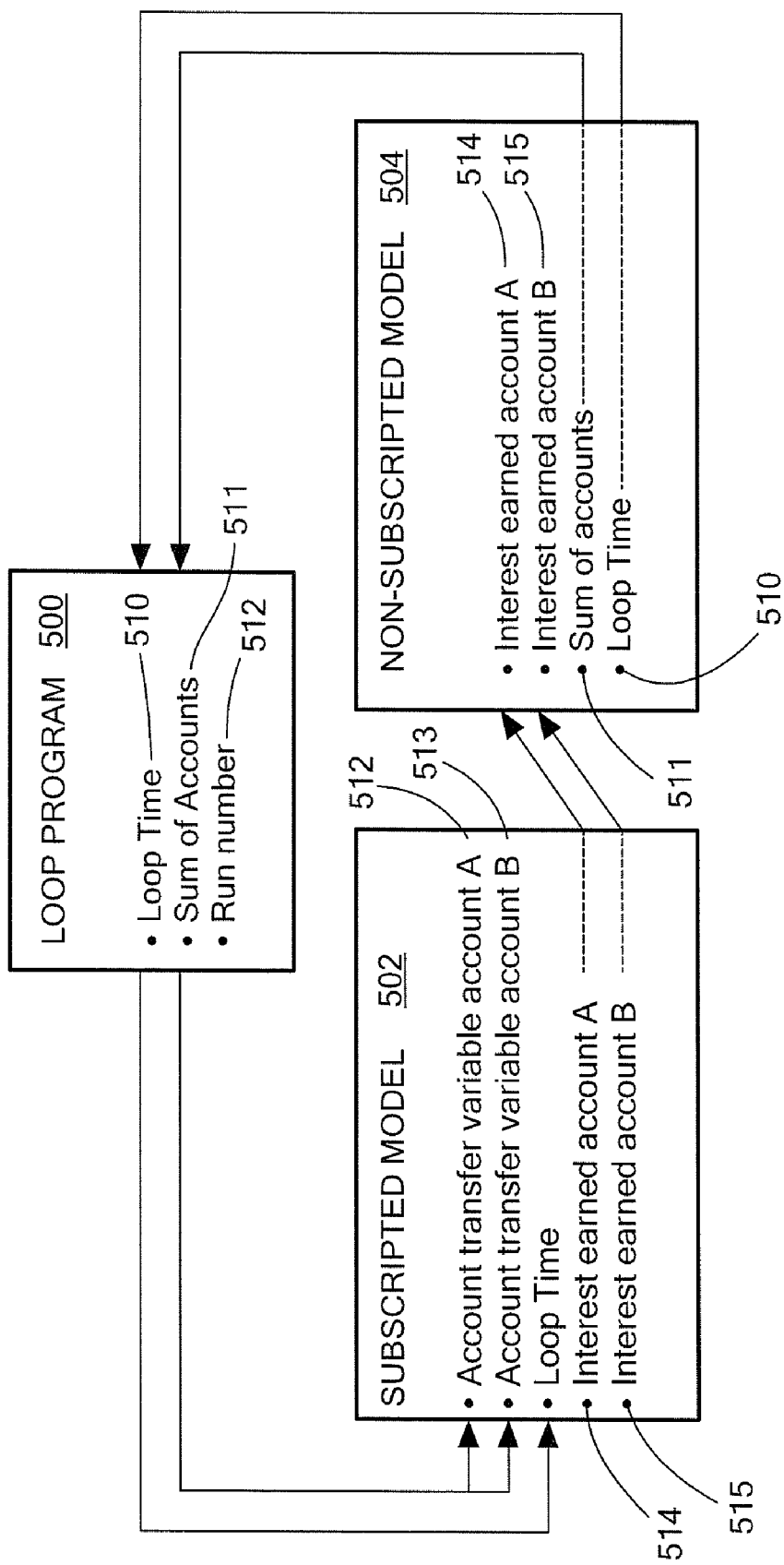
FIG. 5B is a diagram of the loop program in FIG. 5A showing the integration between a first and a second model.

Referring to FIG. 5B, depicting at least one embodiment of the loop program 500 and the control of the first and second models 502, 504, the loop program 500 can include a loop time variable 510 and a run number variable 512. The simulation can be set to run a desired number of times or for a certain length of time, for example, two, three, four, or five times, etc., or one minute, 15 minutes, one hour, one day, etc.

Preferably, the loop time variable 510 represents the accumulated time period for each loop, for example, one second, 15 minutes, one hour, one day, etc., and the run time variable 512 is a counter representing the number of times the loop has executed. Both the loop time variable 510 and the run time variable 512 are incremented after each loop. The loop program 500 stops the simulation once the run time variable 512 equals the desired number of run times. Alternatively, the loop program 500 stops the simulation once the loop time variable 510 equals the desired simulation time length.

The loop time variable 510 and the run time variable 512 can be initialized to 0. The loop program 500 can also include an initial value for sum of accounts 511, for example, $100. The loop program 500 can pass loop time 510 and the sum of accounts 511 to the first model 502. The first model 502 can include an account transfer variable 512, 513 for accounts A and B, for example, $60 and $40, respectively. The first model 502 can also include an interest earned 514, 515 for accounts A and B, for example, $6 and $8, respectively. The interest earned 514, 515 can be passed to the second model 504, which can also include interest earned 514, 515. The second model 504 can include the sum of accounts 511, for example, $114, and the loop time variable 510. The sum of accounts 511 can be passed to the loop program 500, along with the loop time 510. The loop program 500 can increment the run number 512, for example, by one, and if the run number 512 exceeds the number of desired run times, the loop program 500 can stop the simulation and output the simulation results. Otherwise, the loop program 500 can continue the simulation by reexecuting the first and second models 502, 504.

Figure 6:
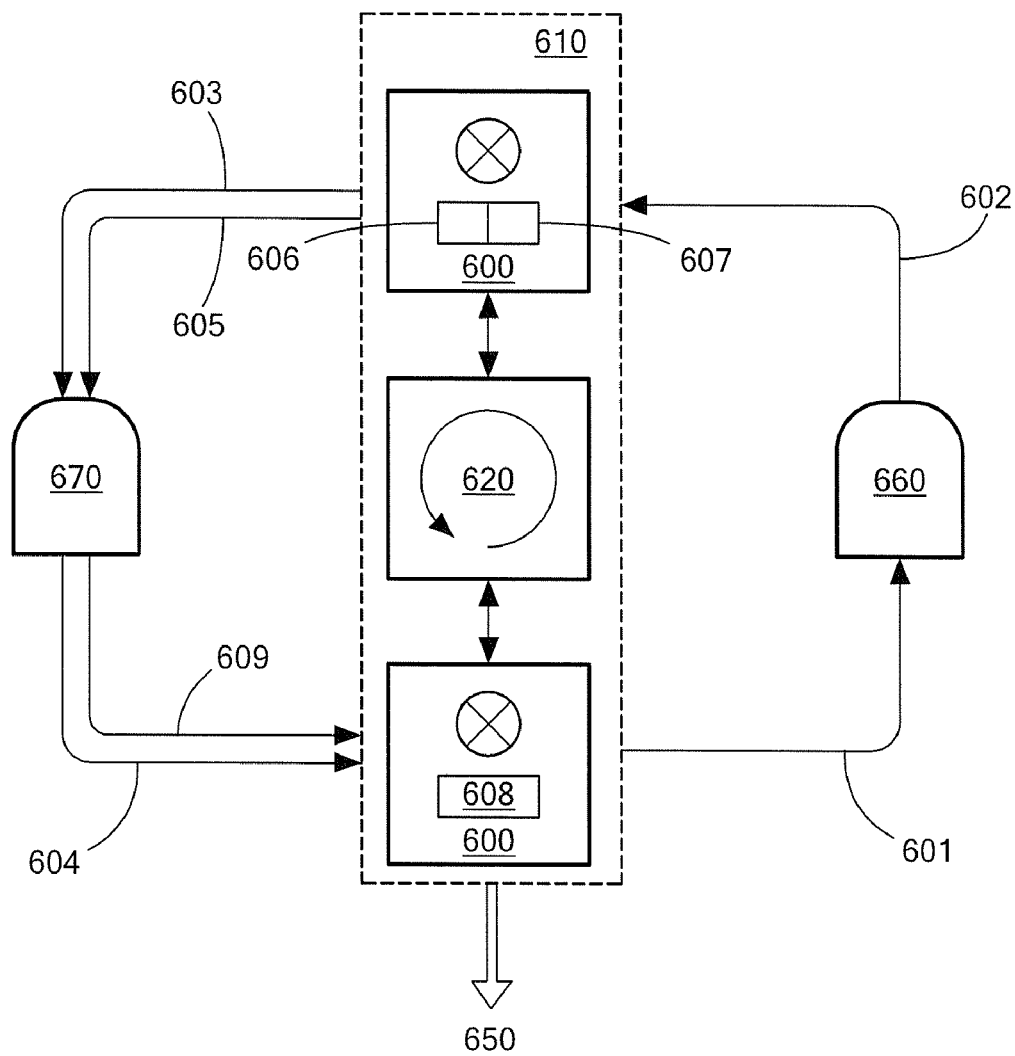
FIG. 6 is a diagram of a data exchanger for passing data between models and a loop program for controlling the execution of the models.

Referring to FIG. 6, the method can further include passing the first and second model outputs 602, 604 using a data exchanger 600. Like the loop program 620, the data exchanger 600 can be implemented as software instructions stored on a memory device.

The data exchanger 600 may be described using the above accumulation of earned interest example. First and second model output 604, 609 can be represented by the account transfer variable and the interest earned variables, outputted from the non-subscripted model 660 and the subscripted model 670. For example, after execution of the non-subscripted model 660, the data exchanger 600 can pass the account transfer variable 606 as inputs 603, 605 to the subscripted model 670. After execution of the subscripted model 670, the data exchanger 600 can pass the interest earned variables for accounts A 604 and B 609 to the non-subscripted model 660. The data exchanger 600 can sum the interest earned variables 604, 609 represented by interest earned transfer variable 608, and pass the sum as an input 601 to the non-subscripted model 660.

In a further embodiment, the data exchanger 600 is a data model, such as a system dynamics Vensim® model. In still a further embodiment, the data model is one of a non-subscripted or subscripted system dynamics Vensim® model.

The data model has at least one data exchanger variable 606, 607, 608. For example, the data exchanger variable can be a percent for each of the accounts A and B in the above example. More particularly, the percent for account A 606 can be 60% of the sum of the accounts, and the percent for account B 607 can be 40% of the sum of the accounts. The data exchange variable can also include a combined earned interest 608 for accounts A and B. The data exchange variables 606, 607 disaggregate the output 602 from the non-subscripted model 660, and the data exchange variable 608 aggregates the output 604,609 from the subscripted model 670.

In this way, the data exchanger 600 can integrate the first and second models. In one embodiment, the data exchanger 600 converts the output of the first model to a format acceptable to the second model, and passes the converted output as an input to the second model. In the other direction, the data exchanger 600 converts the output of the second model to a format acceptable to the first model, and passes the converted output as an input to the first model.

In the above example, the data exchanger 600 integrates the output of the subscripted model with the input of the non-subscripted model by combining the interest earned for each of the accounts A and B and passing the combined interest earned as an input to the non-subscripted model. The data exchanger 600 also integrates the output of the non-subscripted model with the input of the subscripted models by splitting the sum of the accounts into balances for accounts A and B and passing the split balances as an input to the subscripted models.

Referring again to FIG. 6, the method may further include both a loop program 620 for controlling the execution of the first and second models. In this embodiment, the loop program 620 and data exchanger 600 may be coupled such that the loop program 620 stops the execution of the simulation after a desired simulation time has expired. For example, the data exchanger 600 can prompt the loop program 620 to determine whether or not to end the simulation before passing the variables between the models for the next loop execution. The loop program 620 can determine whether the desired simulation time has expired and, if so, can output the simulation results 650. If the desired simulation time has not expired, then the data exchanger 600 can pass the variables between the models for the next loop execution.

In a further embodiment, the loop program 620 may include at least one loop program, for example, a first loop program for controlling a first model 660, a second loop program for controlling the second model 670.

The loop program 620 and the data exchanger 600 may be implemented as a single software program 610 stored as instructions on a memory device.

In another aspect of the inventive systems, techniques, and concepts described herein, stiff models provide a way to simulate a complex system across multiple time domains. As an example, a complex system for flu infectiousness in humans can be studied using a first model for human infectiousness and a second model for viral growth. Typically, a human infected with a flu virus begins to experience flu symptoms within a few days. During the initial period before symptoms occur, the viral population may double every few minutes in the infected human. Once symptoms begin to occur, infected humans can transmit the virus to other humans through the air, for example, by sneezing or coughing large virus-laden droplets.

In conventional simulation, flu infectiousness would have to be simulated using system dynamics models with the same time periods. However, this presents a problem in the flu infectiousness example because viral population can double in minutes, but it may take days for a human infected with the virus to become capable of transmitting the virus to other humans. This problem is often dealt with by executing the human infectiousness model over much smaller time periods than necessary to match the time periods of the viral population model. However, this results in many unnecessary iterations of the human infectiousness model. The extra iterations consume computer resources and add to the overall simulation time.

Using an exemplary stiff model approach, two models can be created with different time periods. In the flu infectiousness example, the first model may be for human infectiousness executing over a time period of two days, and the second model may be for viral population executing over a time period of one minute. For example, the viral population model may be executed 1440 times (48 hours×(60 minutes/hour)×0.5). The results can be passed to the human infectiousness model, which executes a single time and passes the results to the viral population model, and so on.

In at least one embodiment, the method is directed to executing at least a first and a second model, the first and second model executed over a first and second time period, respectively, the first and second time periods being different from each other.

Figure 7:
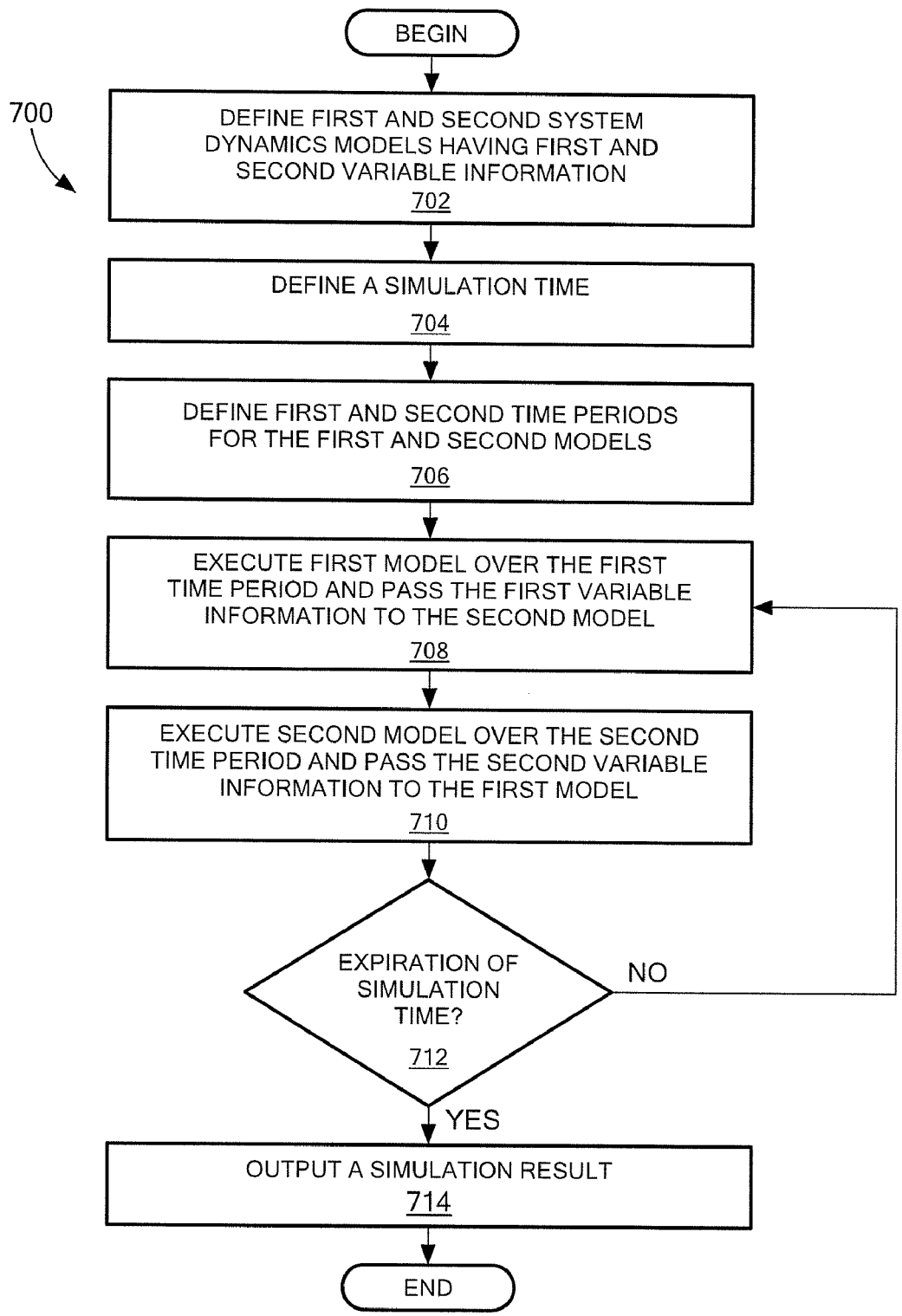
FIG. 7 is a flow diagram of a method for simulating a complex system using stiff models.

Referring to FIG. 7, in at least one embodiment of the inventive systems, techniques, and concepts described herein, a method 700 includes defining 702 a first system dynamics (SD) model having first variable information and a second SD model having second variable information. A simulation time is defined 704. Also, a first time period is defined for the first SD model and a second time period is defined for the second SD model 706.

The first SD model is executed 708 over the first time period and the first variable information is passed to the second SD model. The second SD model is executed 710 over the second time period and the second variable information is passed to the first SD model.

After the expiration of the defined simulation time 712, a simulation result related to the first and second variable information is outputted 714. Preferably, outputting the simulation result includes outputting the first and second variable information to a display screen of a computer or as a hard copy printout.

The first and second models may be Vensim® models. In a further embodiment, the first and second stiff models are at least one of a non-subscripted Vensim® model or a subscripted Vensim® model.

The first time period may be different than the second time period. For example, the first time period may be one month, and the second time period may be 30 days. Preferably, the first time period is a multiple of the second time period, for example, the first time period may be one year, and the second time period may be one $1/16^{th}$ of a year.

However, the first time period need not be a multiple of the second time period. For example, in one embodiment of the method, an asynchronous approach to simulation can be used, wherein the model time periods are event-driven. Here, one of the models could execute at regular time periods, for example, every hour, and another event-driven model could execute when triggered by an event. For example, in a meteorological simulation, one model could execute every five minutes to update weather variables, and another model could execute when a lightning strike occurs. The lightening strike model could execute and obtain a result. A loop program could interrupt the weather variable model and pass the lightening strike data to the weather model. The weather model could then update calculations accordingly.

Figure 8:
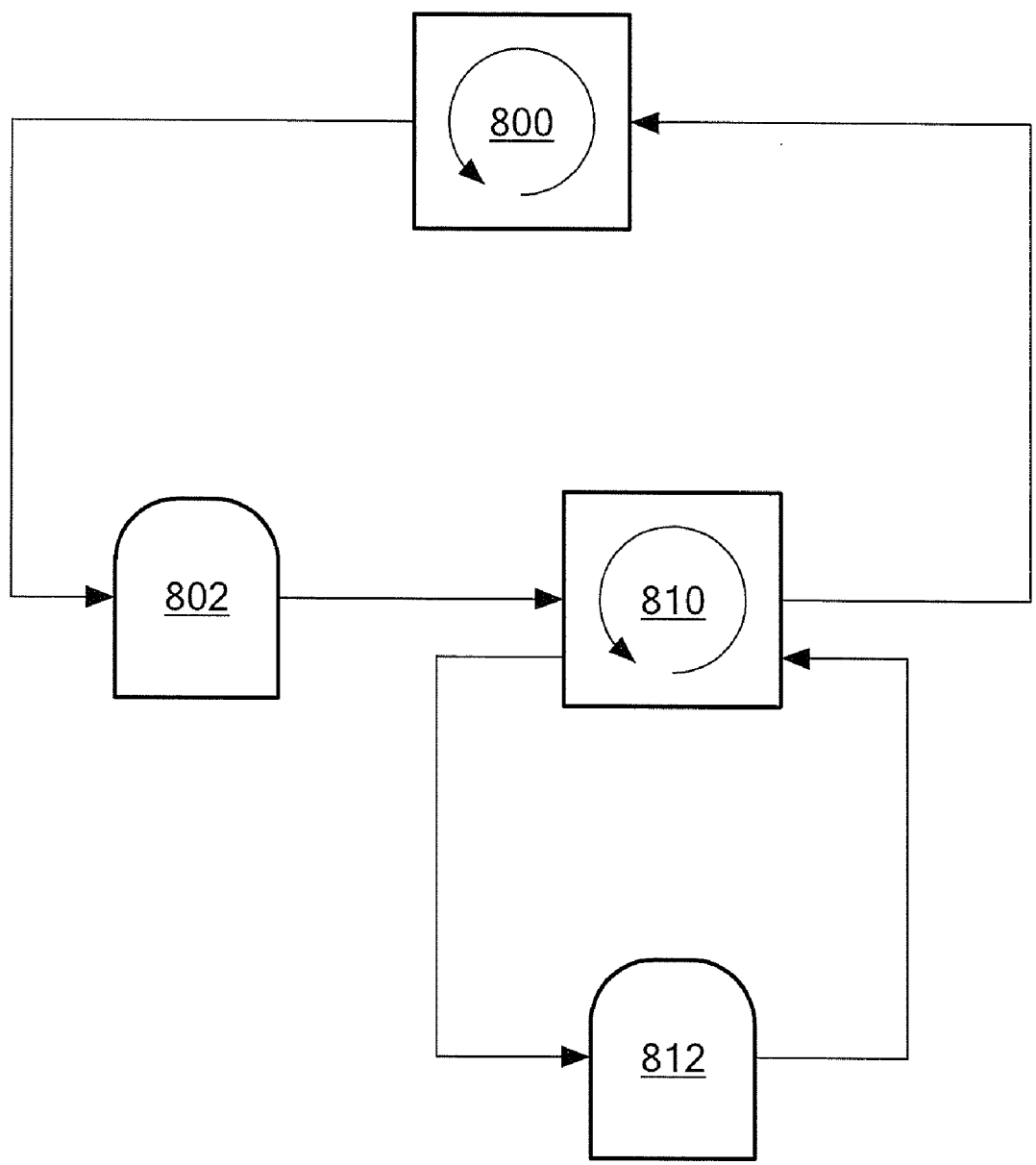
FIG. 8 is a diagram of loop programs to control a first and second model having different time periods.

The stiff model approach can be exemplified using the interest-bearing bank account example described above. A simulation time of one year can be defined. Referring to FIG. 8, more than one loop program 800, 810 may be used to control the execution of first and second models 802, 812. The first model 802 is for determining and compounding the interest earned for a bank account every year. The second model 812 is for determining and compounding the interest earned for the bank account every $1/16^{th}$ of a year. The first model time period is a multiple of the second model time period, i.e., the first model time period is 16 times the second model time period.

TABLE 2 shows the results of running the simulation over one year. The initial bank balance is $100, and the interest rate is 5% (0.05) yearly. Each table row represents one execution of the second model. dt represents $1/16^{th}$, or 0.0625, of a year. $T_{total}$ represents the accumulated time. Interest earned and Bank account balance represent the interest earned and accumulated bank balance for each execution, respectively.

The interest earned at each iteration of the second stiff model can be computed using the following equation:

$$I_E = B \times I_R \times dt \text{ or } I_E = B \times 0.05 \times 0.0625$$

In this equation, B is the current balance, and $I_R$ is the interest rate.

TABLE 2

| Loop time | dt | $T_{total}$ | Interested earned | Bank account balance |
|---|---|---|---|---|
| 0 | 0.0625 | 0 | 0.312500 | 100.000000 |
| 1 | 0.0625 | 0.0625 | 0.313477 | 100.312500 |
| 2 | 0.0625 | 0.1250 | 0.314456 | 100.625977 |
| 3 | 0.0625 | 0.1875 | 0.315439 | 100.940433 |
| 4 | 0.0625 | 0.2500 | 0.316425 | 101.255872 |
| 5 | 0.0625 | 0.3125 | 0.317413 | 101.572296 |
| 6 | 0.0625 | 0.3750 | 0.318405 | 101.889710 |
| 7 | 0.0625 | 0.4375 | 0.319400 | 102.208115 |
| 8 | 0.0625 | 0.5000 | 0.320398 | 102.527515 |
| 9 | 0.0625 | 0.5625 | 0.321400 | 102.847914 |
| 10 | 0.0625 | 0.6250 | 0.322404 | 103.169314 |
| 11 | 0.0625 | 0.6875 | 0.323412 | 103.491718 |
| 12 | 0.0625 | 0.7500 | 0.324422 | 103.815129 |
| 13 | 0.0625 | 0.8125 | 0.325436 | 104.139552 |
| 14 | 0.0625 | 0.8750 | 0.326453 | 104.464988 |
| 15 | 0.0625 | 0.9375 | 0.327473 | 104.791441 |
| 16 | 0.0625 | 1.0000 | 0.328497 | 105.118914 |

Referring again to FIG. 8, loop program 800 can execute the first model 802 a single time, and then pass control to loop program 810 to execute the second model 812 two, three, four, etc. times. The loop program 800 begins the simulation and sets the initial conditions. The loop program 800 passes control to the first model 802, which on the first iteration immediately passes control to loop program 810. The loop program 810 begins executing the second model 812. After each iteration, the loop program 810 updates a loop counter and reexecutes the second model 810 for the next time period (i.e., $0.0625^{th}$ of a year). After sixteen loop times of the second model 812, the loop program 810 outputs a final result, for example the bank account balance, to loop program 800. The loop program 800 can then pass control to the first model 802. This process can continue until the expiration of the simulation time, at which time the results are outputted.

In another example of the interest bearing simulation shown in TABLE 3, the time period dt of the second model can be set to $1/4^{th}$, or $0.25^{th}$ of a year. At the end of one year, the results can be compared to the first simulation shown in TABLE 2. This simulation is executed over four years

TABLE 3

| First loop time | Second loop time | Dt | $T_{total}$ | Interested earned | Bank account balance |
|---|---|---|---|---|---|
| 1 |  | 0 | 100.0000 | 1.250000 | 100.0000 |
|  | 1 | 0.25 | 101.2500 | 1.265625 | 101.2500 |
|  | 2 | 0.50 | 102.5156 | 1.281445 | 102.5156 |
|  | 3 | 0.75 | 103.7971 | 1.297463 | 103.7971 |
|  | 4 | 1.00 | 105.0945 | 1.587320 | 105.0945 |
| 2 |  | 1.00 | 105.0945 | 1.587320 | 105.0945 |
|  | 1 | 1.25 | 106.4082 | 1.330103 | 106.4082 |
|  | 2 | 1.50 | 107.7383 | 1.346729 | 107.7383 |
|  | 3 | 1.75 | 109.085 | 1.363563 | 109.085 |
|  | 4 | 2.00 | 110.4486 | 1.380608 | 110.4486 |
| 3 |  | 2.00 |  |  |  |
|  | 1 | 2.25 | 111.8292 | 1.397865 | 111.8292 |
|  | 2 | 2.50 | 113.2271 | 1.415339 | 113.2271 |

TABLE 3-continued

| First loop time | Second loop time | Dt | $T_{total}$ | Interested earned | Bank account balance |
|---|---|---|---|---|---|
|  | 3 | 2.75 | 114.6424 | 1.43303 | 114.6424 |
|  | 4 | 3.00 | 116.0755 | 1.450943 | 116.0755 |
| 4 |  | 3.00 |  |  |  |
|  | 1 | 3.25 | 117.5264 | 1.46908 | 117.5264 |
|  | 2 | 3.50 | 118.9955 | 1.487443 | 118.9955 |
|  | 3 | 3.75 | 120.4829 | 1.506036 | 120.4829 |
|  | 4 | 4.00 | 121.989 | 1.524862 | 121.989 |

Figure 9:
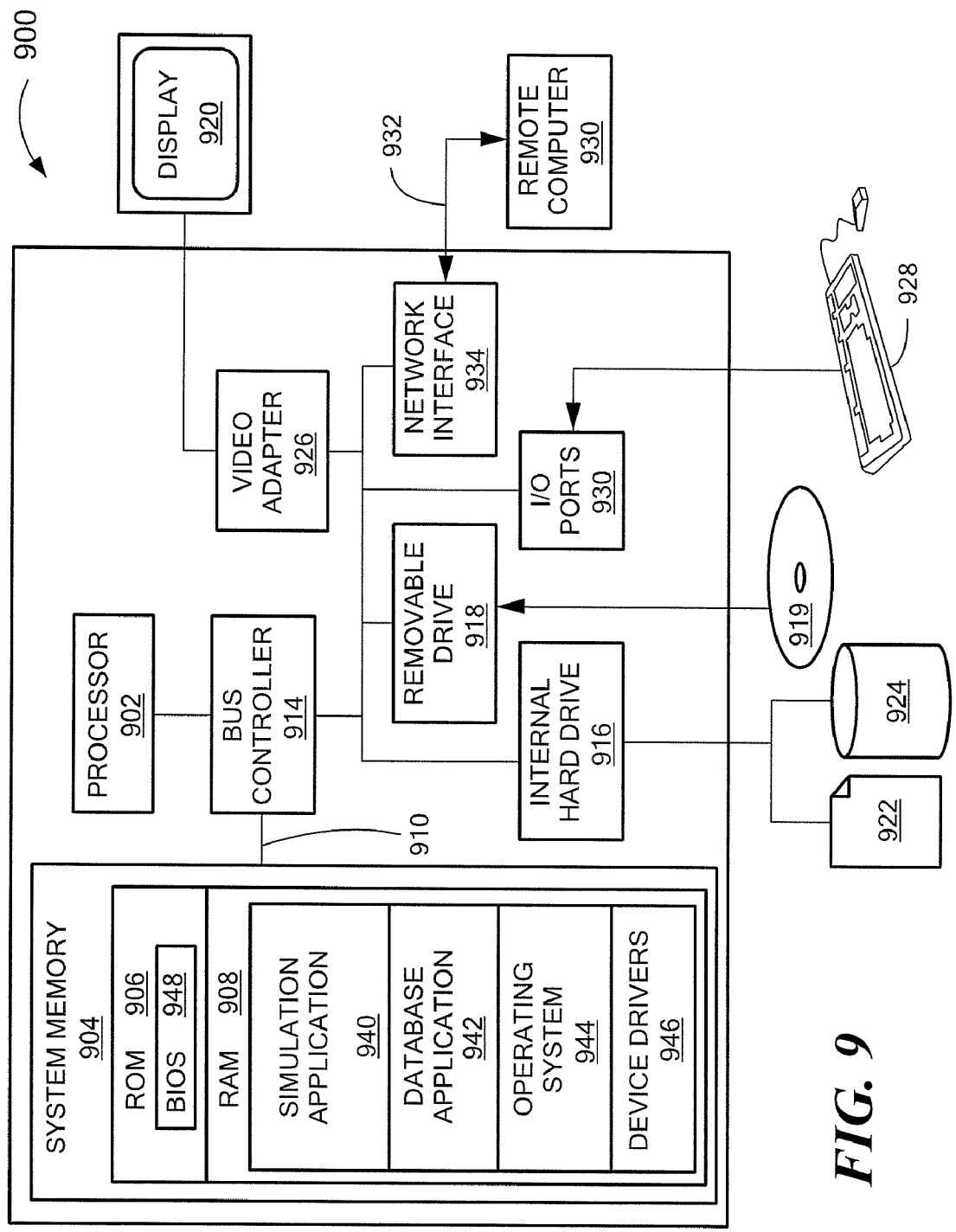
FIG. 9 is a diagram showing an exemplary hardware and operating environment of a suitable computer for use with embodiments of the inventive systems, techniques, and concepts described herein.

FIG. 9 illustrates a computer 900 suitable for supporting the operation of embodiments of the inventive systems, concepts, and techniques described herein. The computer 900 includes a processor 902, for example, a dual-core processor, such as the AMD Athlon™ X2 Dual Core processor from the Advanced Micro Devices Corporation. However, it should be understood that the computer 900 may use other microprocessors. Computer 900 can represent any server, personal computer, laptop, or even a battery-powered mobile device such as a hand-held personal computer, personal digital assistant, or smart phone.

Computer 900 includes a system memory 904 which is connected to the processor 902 by a system data/address bus 910. System memory 904 includes a read-only memory (ROM) 906 and random access memory (RAM) 908. The ROM 906 represents and device that is primarily read-only including electrically erasable programmable read-only memory (EEPROM), flash memory, etc. RAM 908 represents any random access memory such as Synchronous Dynamic Random Access Memory (SDRAM). The Basic Input/Output System (BIOS) 948 for the computer 900 is stored in ROM 906 and loaded into RAM 908 upon booting.

Within the computer 900, input/output (I/O) bus 912 is connected to the data/address bus 910 via a bus controller 914. In one embodiment, the I/O bus 912 is implemented as a Peripheral Component Interconnect (PCI) bus. The bus controller 914 examines all signals from the processor 902 to route signals to the appropriate bus. Signals between processor 902 and the system memory 904 are passed through the bus controller 914. However, signals from the processor 902 intended for devices other than system memory 904 are routed to the I/O bus 912.

Various devices are connected to the I/O bus 912 including internal hard drive 916 and removable storage drive 918 such as a CD-ROM drive used to read a compact disk 919 or a floppy drive used to read a floppy disk. The internal hard drive 916 is used to store data, such as in files 922 and database 924. Database 924 includes a structured collection of data, such as a relational database. A display 920, such as a cathode ray tube (CRT), liquid-crystal display (LCD), etc. is connected to the I/O bus 912 via a video adapter 926.

A user enters commands and information into the computer 900 by using input devices 928, such as a keyboard and a mouse, which are connected to I/O bus 912 via I/O ports 930. Other types of pointing devices that may be used include track balls, joy sticks, and tracking devices suitable for positioning a cursor on a display screen of the display 920.

Computer 900 may include a network interface 934 to connect to a remote computer 930, an intranet, or the Internet via network 932. The network 932 may be a local area network or any other suitable communications network.

Computer-readable modules and applications 940 and other data are typically stored on memory storage devices, which may include the internal hard drive 916 or the compact disk 919, and are copied to the RAM 908 from the memory storage devices. In one embodiment, computer-readable modules and applications 940 are stored in ROM 906 and copied to RAM 908 for execution, or are directly executed from ROM 906. In still another embodiment, the computer-readable modules and applications 940 are stored on external storage devices, for example, a hard drive of an external server computer, and delivered electronically from the external storage devices via network 932.

The computer 900 may execute a database application 942, such as Oracle™ database from Oracle Corporation, to model, organize, and query data stored in database 924. The data may be used by the computer-readable modules and applications 940 and/or passed over the network 932 to the remote computer 930 and other systems.

In general, the operating system 944 executes computer-readable modules and applications 940 and carries out instructions issued by the user. For example, when the user wants to execute a computer-readable module 940, the operating system 944 interprets the instruction and causes the processor 902 to load the computer-readable module 940 into RAM 908 from memory storage devices. Once the computer-readable module 940 is loaded into RAM 908, it can be used by the processor 902 to carry out various instructions. The processor 902 may also load portions of computer-readable modules and applications 940 into RAM 908 as needed. The operating system 944 uses device drivers 946 to interface with various devices, including memory storage devices, such as hard drive 916 and removable storage drive 918, network interface 934, I/O ports 930, video adapter 926, and printers.

Having described exemplary embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method for simulating complex systems over time comprising:
   defining a first model of a complex system, the first model having a first model variable;
   defining a second model of the complex system, the second model having a second model variable;
   executing the first model by modifying the first model variable to obtain a first model output;
   executing the second model by passing the first model output to the second model and modifying the second model variable based the first model output to obtain a second model output;
   defining a simulation result based on the first and second model outputs; and
   outputting the simulation result,
   wherein the first model is at least one of a non-subscripted system dynamics model representing an overall behavior model of the complex system without arrays or a subscripted system dynamics model representing an overall behavior model of the complex system with arrays, and the second model is at least one of a non-subscripted system dynamics model representing an overall behavior model of the complex system without arrays or a subscripted system dynamics model representing an overall behavior model of the complex system with arrays.

2. The method of claim 1, further comprising:
reexecuting the first model by passing the second model output to the first model and modifying the first model variable based the second model output to obtain the simulation result.

3. The method of claim 1, wherein the first model variable is a plurality of first model variables to describe a behavior of the first model, and the second model variable is a plurality of second model variables to describe a behavior of the second model.

4. The method of claim 1, wherein executing the first model further includes executing the first model over a first model time period, and executing the second model further includes executing the second model over a second model time period.

5. The method of claim 4, wherein the first model time period is different than the second model time period.

6. The method of claim 5, wherein executing the first and second model is controlled by at least one loop program based on the first and second model time period.

7. The method of claim 5, wherein passing the first and second model output is controlled by a data exchanger.

8. The method of claim 4, wherein executing the first model includes executing the first model a number of first model loop times and for each execution of the first model, the second model is executed a number of second model loop times.

9. The method of claim 8, wherein the first model output is passed to the second model, and the second model output is passed to the first model after executing the second model the number of second model loop times.

10. The method of claim 1, wherein outputting the simulation results includes displaying the simulation results.

11. The method of claim 1 wherein the first model is one of a non-subscripted system dynamics model representing an overall behavior model of the complex system without arrays or a subscripted system dynamics model representing an overall behavior model of the complex system with arrays, and the second model is the other one of the non-subscripted system dynamics model or the subscripted system dynamics model.

12. A method for simulating complex systems over time comprising:
defining a first system dynamics model (F-SDM) of a complex system, the F-SDM having at least one first variable;
defining a second system dynamics model (S-SDM) of the complex system, the S-SDM having at least one second variable;
executing the F-SDM by modifying the at least one first variable according to at least one F-SDM behavior to obtain a first output;
executing the S-SDM by passing the first output to the S-SDM and modifying the at least one second model variable according to at least one S-SDM behavior and the first output to obtain a second output;
defining a simulation result based on at least one of the first or second outputs; and
outputting the simulation result,
wherein the F-SDM is one of a non-subscripted system dynamics model representing an overall behavior model of the complex system without arrays or a subscripted system dynamics model representing an overall behavior model of the complex system with arrays, and the S-SDM is one of a non-subscripted system dynamics model representing an overall behavior model of the complex system without arrays or a subscripted system dynamics model representing an overall behavior model of the complex system with arrays.

13. The method of claim 12, wherein executing the F-SDM and the S-SDM is controlled by at least one loop program and passing the first and second outputs is controlled by a data exchanger.

14. The method claim 13, wherein the S-SDM is at least two second system dynamics models and the data exchanger aggregates the at least one second output for the at least two second system dynamics models, and the data exchanger disaggregates the at least one first output.

15. The method of claim 12 wherein the F-SDM is one of a non-subscripted system dynamics model representing an overall behavior model of the complex system without arrays or a subscripted system dynamics model representing an overall behavior model of the complex system with arrays, and the S-SDM is the other one of the non-subscripted system dynamics model or the subscripted system dynamics model.

16. An article, comprising:
a non-transitory machine-readable medium that stores executable instructions that cause a machine to:
define a first model of a complex system, the first model having a first model variable;
define a second model of the complex system, the second model having a second model variable;
execute the first model by modifying the first model variable to obtain a first model output;
execute the second model by passing the first model output to the second model and modifying the second model variable based the first model output to obtain a second model output;
define a simulation result based on the first and second model outputs; and
output the simulation result,
wherein the first model is at least one of a non-subscripted system dynamics model representing an overall behavior model of the complex system without arrays or a subscripted system dynamics model representing an overall behavior model of the complex system with arrays, and the second model is at least one of a non-subscripted system dynamics model representing an overall behavior model of the complex system without arrays or a subscripted system dynamics model representing an overall behavior model of the complex system with arrays.

17. The article according to claim 16, wherein the executable instructions further cause a machine to:
reexecute the first model by passing the second model output to the first model and modifying the first model variable based the second model output to obtain the simulation result.

18. The article according to claim 16, wherein the first model variable is a plurality of first model variables to describe a behavior of the first model, and the second model variable is a plurality of second model variables to describe a behavior of the second model.

19. The article according to claim 16, wherein the first model executes over a first model time period, and the second model executes over a second model time period.

20. The article according to claim 19, wherein the first model time period is different than the second model time period.

21. The article according to claim 20, wherein the executable instruction further cause a machine to execute at least one loop program to execute the first and second model based on the first and second model time periods.

22. The article according to claim 20, wherein the executable instructions further cause a machine to execute a data exchanger to pass the first and second model outputs.

23. The article according to claim 19, wherein the first model executes a number of first model loop times and for each execution of the first model, the second model executes a number of second model loop times.

24. The article according to claim 23, wherein the first model output is passed to the second model, and the second model output is passed to the first model after execution of the second model the number of second model loop times.

25. The article according to claim 16, wherein the output of the simulation results enables a display of the simulation results.

26. The article of claim 16 wherein the first model is one of a non-subscripted system dynamics model representing an overall behavior model of the complex system without arrays or a subscripted system dynamics model representing an overall behavior model of the complex system with arrays, and the second model is the other one of the non-subscripted system dynamics model or the subscripted system dynamics model.

* * * * *